US009984899B2

United States Patent
Suzuki et al.

(10) Patent No.: US 9,984,899 B2
(45) Date of Patent: May 29, 2018

(54) CERAMIC PACKAGE WITH BRAZING MATERIAL NEAR SEAL MEMBER

(71) Applicant: NGK SPARK PLUG CO., LTD., Nagoya-shi, Aichi (JP)

(72) Inventors: Toshio Suzuki, Komaki (JP); Masami Kanayama, Komaki (JP); Akiyoshi Hattori, Komaki (JP); Masanori Kitou, Iwakura (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 15 days.

(21) Appl. No.: 15/166,491

(22) Filed: May 27, 2016

(65) Prior Publication Data

US 2016/0358832 A1    Dec. 8, 2016

(30) Foreign Application Priority Data

Jun. 2, 2015    (JP) .................................. 2015-112022
Apr. 11, 2016    (JP) .................................. 2016-078847

(51) Int. Cl.
*H01L 21/50* (2006.01)
*H01L 23/10* (2006.01)

(52) U.S. Cl.
CPC .............. *H01L 21/50* (2013.01); *H01L 23/10* (2013.01)

(58) Field of Classification Search
None
See application file for complete search history.

(56) References Cited

U.S. PATENT DOCUMENTS

| 3,566,209 | A | * | 2/1971 | Shaw | H01B 1/00 148/537 |
| 3,697,666 | A | * | 10/1972 | Wakley | H01L 23/047 174/50.64 |
| 3,872,331 | A | * | 3/1975 | Falco | H01L 23/057 174/559 |
| 3,941,916 | A | * | 3/1976 | Morse | H01L 23/057 174/260 |
| 3,943,557 | A | * | 3/1976 | Frazee | G01N 27/121 174/564 |

(Continued)

FOREIGN PATENT DOCUMENTS

JP    H07-63083 B2    7/1995

*Primary Examiner* — Dimary Lopez Cruz
*Assistant Examiner* — Muhammed Azam
(74) *Attorney, Agent, or Firm* — Stites & Harbison, PLLC; Jeffrey A. Haeberlin

(57) ABSTRACT

A ceramic package includes a ceramic substrate, a metallization layer, a first plating layer, a brazing material layer, and a seal member. The ceramic substrate has a surface, and the metallization layer is disposed along an outer periphery of a predetermined region on the surface. The first plating layer is disposed on the metallization layer. The brazing material layer is disposed on the metallization layer with the first plating layer interposed therebetween. The seal member is joined on the metallization layer via the brazing material layer. In at least one of an outer peripheral portion and an inner peripheral portion of the brazing material layer, an end of the brazing material layer is located outside a region directly below the seal member and the end of the brazing material layer is positioned nearer to the seal member than an end of the metallization layer.

8 Claims, 9 Drawing Sheets

(56) References Cited

U.S. PATENT DOCUMENTS

| | | | | |
|---|---|---|---|---|
| 4,506,108 A * | 3/1985 | Kersch | H05K 5/0095 | 174/527 |
| 4,551,747 A * | 11/1985 | Gilbert | H01L 23/057 | 257/691 |
| 4,558,346 A * | 12/1985 | Kida | H01L 21/50 | 228/123.1 |
| 4,640,436 A * | 2/1987 | Miyoshi | H01L 23/10 | 174/564 |
| 4,769,272 A * | 9/1988 | Byrne | B23K 1/14 | 174/538 |
| 4,833,102 A * | 5/1989 | Byrne | B23K 1/14 | 174/50.51 |
| 4,888,449 A * | 12/1989 | Crane | H01L 23/057 | 174/540 |
| 4,897,508 A * | 1/1990 | Mahulikar | H01L 21/50 | 174/17 GF |
| 4,907,067 A * | 3/1990 | Derryberry | H01L 23/057 | 257/700 |
| 5,031,069 A * | 7/1991 | Anderson | H01L 23/642 | 257/703 |
| 5,073,085 A * | 12/1991 | Ito | C04B 37/026 | 415/216.1 |
| 5,122,862 A * | 6/1992 | Kajihara | H01L 21/50 | 257/703 |
| 5,159,432 A * | 10/1992 | Ohkubo | H01L 23/10 | 257/702 |
| 5,247,134 A * | 9/1993 | Beltz | H01L 21/50 | 174/527 |
| 5,261,157 A * | 11/1993 | Chang | H01L 21/50 | 156/285 |
| 5,268,533 A * | 12/1993 | Kovacs | H01L 23/04 | 174/524 |
| 5,315,486 A * | 5/1994 | Fillion | H01L 23/057 | 174/253 |
| 5,438,219 A * | 8/1995 | Kotzan | H03H 9/0514 | 257/469 |
| 5,451,818 A * | 9/1995 | Chan | H01L 23/66 | 257/701 |
| 5,455,385 A * | 10/1995 | Newton | H01L 21/4857 | 174/259 |
| 5,574,314 A * | 11/1996 | Okada | H01L 23/10 | 257/659 |
| 5,714,409 A * | 2/1998 | Parsons | G01L 19/0084 | 430/51 |
| 5,792,984 A * | 8/1998 | Bloom | H01L 23/10 | 174/536 |
| 5,798,566 A * | 8/1998 | Sato | H01L 23/367 | 257/703 |
| 5,818,699 A * | 10/1998 | Fukuoka | H01L 23/10 | 257/353 |
| 5,825,088 A * | 10/1998 | Bartlow | H01L 23/4006 | 257/712 |
| 5,864,092 A * | 1/1999 | Gore | H01L 23/49805 | 174/260 |
| 5,949,654 A * | 9/1999 | Fukuoka | H01L 21/50 | 257/700 |
| 6,140,698 A * | 10/2000 | Damphousse | H01L 23/66 | 257/704 |
| 6,476,486 B1 * | 11/2002 | Humphrey | H01L 23/49816 | 257/738 |
| 6,531,334 B2 * | 3/2003 | Sasano | H01L 27/14618 | 29/827 |
| 6,836,953 B2 * | 1/2005 | Fries | A61B 5/1172 | 29/592.1 |
| 6,847,115 B2 * | 1/2005 | Crane, Jr. | H01L 23/057 | 174/355 |
| 6,883,977 B2 * | 4/2005 | Dautartas | G02B 6/4201 | 257/433 |
| 6,885,561 B1 * | 4/2005 | Hashemi | H01L 23/552 | 174/260 |
| 6,888,239 B1 * | 5/2005 | Kim | H01L 21/50 | 257/704 |
| 7,345,316 B2 * | 3/2008 | Sherrer | G02B 6/4201 | 257/432 |
| 7,518,775 B2 * | 4/2009 | Miles | B81C 1/0023 | 359/238 |
| 7,668,415 B2 * | 2/2010 | Tyger | G02B 26/001 | 359/245 |
| 7,701,631 B2 * | 4/2010 | Floyd | B81C 1/00269 | 359/290 |
| 8,431,820 B2 * | 4/2013 | Yamamoto | H01L 23/06 | 174/50.5 |
| 8,431,835 B2 * | 4/2013 | Chiang | G03F 7/0012 | 174/563 |
| 8,441,774 B2 * | 5/2013 | Masuda | H01G 4/01 | 174/250 |
| 8,708,465 B1 * | 4/2014 | Cellura | B41J 2/161 | 347/70 |
| 9,490,772 B2 * | 11/2016 | Hasegawa | H03H 9/0552 | |
| 9,560,739 B2 * | 1/2017 | Nishida | H05K 3/3452 | |
| 9,640,452 B2 * | 5/2017 | Tsujino | H01L 23/047 | |
| 2002/0033652 A1 * | 3/2002 | Serizawa | H03H 9/0547 | 310/348 |
| 2003/0223709 A1 * | 12/2003 | Lake | G02B 6/4201 | 385/94 |
| 2004/0240142 A1 * | 12/2004 | Fujii | H01L 21/6831 | 361/233 |
| 2004/0245896 A1 * | 12/2004 | Serizawa | H03H 9/0547 | 310/365 |
| 2005/0207092 A1 * | 9/2005 | Kubota | H01L 23/047 | 361/301.3 |
| 2005/0212387 A1 * | 9/2005 | Sasagawa | H03H 9/0547 | 310/348 |
| 2005/0225406 A1 * | 10/2005 | Miura | H03L 1/026 | 331/176 |
| 2006/0125076 A1 * | 6/2006 | Fukagaya | H01L 23/04 | 257/690 |
| 2006/0187608 A1 * | 8/2006 | Stark | C03C 27/08 | 361/202 |
| 2006/0191215 A1 * | 8/2006 | Stark | C03C 27/08 | 52/204.6 |
| 2007/0251860 A1 * | 11/2007 | Kojo | H01L 23/06 | 206/719 |
| 2008/0142068 A1 * | 6/2008 | Bean | F25B 21/02 | 136/201 |
| 2008/0231145 A1 * | 9/2008 | Nagano | B22F 1/0074 | 310/344 |
| 2010/0143760 A1 * | 6/2010 | DeRose | H01M 8/0271 | 429/495 |
| 2011/0272796 A1 * | 11/2011 | Eaton | B81C 1/00269 | 257/682 |
| 2013/0128489 A1 * | 5/2013 | Satake | H01L 23/057 | 361/820 |
| 2014/0084752 A1 * | 3/2014 | Miyasaka | G01C 19/5628 | 310/348 |
| 2015/0123737 A1 * | 5/2015 | Yokoo | H03H 9/0552 | 331/34 |
| 2015/0155849 A1 * | 6/2015 | Kikuchi | H03H 9/172 | 310/348 |
| 2016/0095214 A1 * | 3/2016 | Fukui | H03H 9/725 | 174/258 |
| 2016/0113138 A1 * | 4/2016 | Au | H01L 23/055 | 257/698 |
| 2016/0358832 A1 * | 12/2016 | Suzuki | H01L 23/10 | |
| 2017/0148693 A1 * | 5/2017 | Shibayama | H01L 23/047 | |

\* cited by examiner

| SAMPLE No. | INTER-END DISTANCE ED [mm] | TEST RESULTS (NUMBER OF CORRESPONDING SAMPLES AMONG 20 SAMPLES) | | | | |
|---|---|---|---|---|---|---|
| | | 70 HOURS | 216 HOURS | 312 HOURS | 480 HOURS | 1056 HOURS |
| S10 | 0 | 0 | 0 | 1 | 3 | 7 |
| S11 | 0.005 | 0 | 0 | 1 | 3 | 4 |
| S12 | 0.008 | 0 | 0 | 1 | 3 | 7 |
| S13 | 0.011 | 0 | 0 | 0 | 1 | 3 |
| S14 | 0.024 | 0 | 0 | 0 | 0 | 0 |
| S15 | 0.035 | 0 | 0 | 0 | 0 | 0 |
| S16 | 0.044 | 0 | 0 | 0 | 0 | 0 |
| S17 | 0.075 | 0 | 0 | 0 | 0 | 0 |

\* TEST CONDITIONS: TEMPERATURE 60°C/ RELATIVE HUMIDITY 90%RH

FIG. 8

| SAMPLE No. | THICKNESS OF FIRST PLATING LAYER [μm] | THICKNESS OF SECOND PLATING LAYER [μm] | INTER-END DISTANCE ED [mm] | HEAT TREATMENT AFTER SECOND PLATING PROCESSING | TEST RESULTS (NUMBER OF CORRESPONDING SAMPLES AMONG 20 SAMPLES) | | |
|---|---|---|---|---|---|---|---|
| | | | | | 75 HOURS | 480 HOURS | 1000 HOURS |
| S20 | 1.2 | 2.5 | — | NOT PERFORMED | 0 | 2 | 16 |
| S21 | 1.7 | 2.5 | — | NOT PERFORMED | 0 | 1 | 13 |
| S22 | 1.2 | 4.0 | — | NOT PERFORMED | 0 | 2 | 5 |
| S23 | 1.2 | 2.5 | — | PERFORMED | 0 | 2 | 12 |
| S24 | 1.2 | 2.5 | 0.024 | NOT PERFORMED | 0 | 0 | 0 |
| S25 | 1.2 | 2.5 | 0.024 | PERFORMED | 0 | 0 | 0 |

* TEST CONDITIONS: TEMPERATURE 60°C/ RELATIVE HUMIDITY 93%RH

FIG. 9

CERAMIC PACKAGE WITH BRAZING MATERIAL NEAR SEAL MEMBER

CROSS REFERENCE TO RELATED APPLICATIONS

The present application claims priority to Japanese Patent Application Nos. 2015-112022 and 2016-078847, which were filed on Jun. 2, 2015 and Apr. 11, 2016, respectively, the disclosures of which are herein incorporated by reference in their entirety.

BACKGROUND OF THE INVENTION

Field of the Invention

The present invention relates to a ceramic package and a production method therefor.

Description of Related Art

In some ceramic packages, brazing is performed for joining metal materials to each other. For example, in Patent Document 1 described below, a terminal is brazed to a lead connection portion formed on a ceramic substrate, by a silver brazing alloy. In some other ceramic packages, a metallic seal ring is brazed to a ceramic substrate. The seal ring is a seal member for hermetically joining a metal lid that is a metallic lid member for covering an element mounted on the ceramic substrate. The seal ring is brazed to a metallization layer that is formed on the ceramic substrate beforehand.

RELATED ART DOCUMENT

Patent Document 1 is Japanese Examined Patent Publication (kokoku) No. H07-63083.

BRIEF SUMMARY OF THE INVENTION

The inventors of the present invention have conducted research for a ceramic package and have found that a metal component partially melts out at a joint portion of a brazed seal member in a high-temperature and high-humidity environment in some cases. As described above, there is still room for improvement in the technique to suppress deterioration of a brazed joint portion in a ceramic package.

The present invention has been made to solve the above-described problem, and can be embodied in the following modes.

[1] According to a first aspect of the present invention, a ceramic package is provided. The ceramic package may include a ceramic substrate, a metallization layer, a (first) plating layer, a brazing material layer, and a seal member. The ceramic substrate may have a pair of surfaces. The metallization layer may be disposed along an outer periphery of a predetermined region on the surface of the ceramic substrate. The (first) plating layer may be disposed on the metallization layer. The brazing material layer may be disposed on the metallization layer with the (first) plating layer interposed therebetween. The seal member may be joined on the metallization layer via the brazing material layer. At least one of an outer peripheral portion and an inner peripheral portion of the brazing material layer, an end of the brazing material layer may be located outside a region directly below the seal member and at a position at the seal member side away from an end of the metallization layer by 0.02 mm or greater. In other words, at least one of an outer peripheral portion and an inner peripheral portion of the brazing material layer, an end of the brazing material layer is located outside a region directly below the seal member and the end of the brazing material layer is positioned at least 0.02 mm nearer to the seal member than an end of the metallization layer. According to the ceramic package of this aspect, melting-out of a metal component at a joint portion of the seal member is suppressed. Therefore, in the ceramic package, deterioration of electrical characteristics such as a decrease in insulation properties, and deterioration of appearance, etc. are suppressed.

[2] In the ceramic package of the above aspect, the (first) plating layer may have a thickness of not less than 1.5 μm and not greater than 5 μm at least at a portion interposed between the metallization layer and the brazing material layer. In other words, at least a portion of the (first) plating layer that is interposed between the metallization layer and the brazing material layer has a thickness of not less than 1.5 μm and not greater than 5 μm. According to the ceramic package of this aspect, melting-out of the metal component from the joint portion of the seal member is suppressed further.

[3] In the ceramic package of the above aspect, a second plating layer may be further formed on the brazing material layer, such that at least one of an outer peripheral end and an inner peripheral end of the second plating layer may be in contact with the first plating layer, and the second plating layer may have a thickness of not less than 1.5 μm and not greater than 5 μm at least at a portion located on the brazing material layer. In other words, at least a portion of the second plating layer that is located on the brazing material layer has a thickness of not less than 1.5 μm and not greater than 5 μm. According to the ceramic package of this aspect, melting-out of the metal component from the joint portion of the seal member is suppressed further.

[4] In the ceramic package of the above aspect, a cavity opened in one direction may be formed in the surface of the ceramic substrate by a wall portion surrounding the region, and the metallization layer may be formed on an upper end surface of the wall portion surrounding the cavity. In other words, a wall portion defines a cavity that opens in one direction at the surface of the ceramic substrate, the wall portion surrounding the predetermined region, and the metallization layer is formed on an upper end surface of the wall portion surrounding the cavity. According to the ceramic package of this aspect, melting-out of the metal component from the joint portion of the seal member provided at the periphery of the opening of the cavity is suppressed.

[5] In the ceramic package of the above aspect, at least one of the outer peripheral portion and the inner peripheral portion of the brazing material layer, the brazing material layer may be in contact with a bottom surface of the seal member and a lower end of a side surface of the seal member. According to the ceramic package of this aspect, joining strength of the seal member by the brazing material layer is enhanced.

[6] In the ceramic package of the above aspect, in a cross-section along a lamination direction of the brazing material layer and the metallization layer, a contour line of at least one of the outer peripheral portion and the inner peripheral portion of the brazing material layer may have an end portion forming a curved line that extends downward from the side surface of the seal member and is convex downward. According to the ceramic package of this aspect, the joining strength of the seal member by the brazing material layer is enhanced further.

[7] According to a second aspect of the present invention, a method for producing a ceramic package is provided. The method of the aspect may include a metallization layer forming step, a first plating step, a brazing material layer forming step, a joining step, a second plating step, and a heating step. The metallization layer forming step may be a step of forming a metallization layer along an outer periphery of a predetermined region on a surface of a ceramic substrate having a pair of surfaces. The first plating step may be a step of forming a first plating layer on the metallization layer. The joining step may be a step of brazing a seal member to the metallization layer via the brazing material layer. The second plating step may be a step of further forming a second plating layer on the brazing material layer after the joining step. The heating step may be a step of heating the ceramic substrate at a temperature of 500° C. or higher after the second plating step. According to the ceramic package produced by the method of this aspect, melting-out of a metal component from a joint portion of the seal member is suppressed.

[8] The method of the aspect may further include an end adjusting step of processing an end of the brazing material layer before the second plating step such that at least one of an outer peripheral end and an inner peripheral end of the brazing material layer is located at a position inwardly away from an outer peripheral end or an inner peripheral end of the metallization layer by 0.02 mm or greater. In other words, at least one of an outer peripheral end and an inner peripheral end of the brazing material layer is positioned at least 0.02 mm inwardly away from a respective outer peripheral end or an inner peripheral end of the metallization layer. According to the ceramic package produced by the method of this aspect, melting-out of the metal component from the joint portion of the seal member is suppressed further.

All the components included in the respective aspects of the present invention are not essential, and part of the components can be changed, deleted, and replaced with other new components, and their limitations contents can be partly deleted, as appropriate, in order to solve part or all of the foregoing problems or achieve part or all of the effects described in the present specification. Moreover, in order to solve part or all of the foregoing problems or achieve part or all of the effects described in the present specification, part or all of the technical features included in the above-mentioned one aspect of the present invention can be combined with part or all of the technical features included in the above-mentioned other aspect of the present invention, to make the combination an independent aspect of the present invention.

The present invention can be embodied in various forms other than the ceramic package and the production method therefor. For example, the present invention can be embodied in forms such as a ceramic package in which a seal member is joined to a metal lid, a device used for production of a ceramic package, and a method for brazing a metal member to a ceramic substrate.

BRIEF DESCRIPTION OF THE DRAWINGS

Illustrative aspects of the invention will be described in detail with reference to the following figures wherein:

FIG. 8 is an explanatory diagram showing test results of an environmental test in Experimental Example 1.

FIG. 9 is an explanatory diagram showing test results of an environmental test in Experimental Example 2.

DETAILED DESCRIPTION OF EXEMPLARY EMBODIMENTS OF THE INVENTION

Embodiments of the present invention will be described in the following order: A. first embodiment; B. second embodiment; C. third embodiment; D. experimental examples; and E. modified embodiments.

A. First Embodiment

Configuration of Ceramic Package

Figure 1:
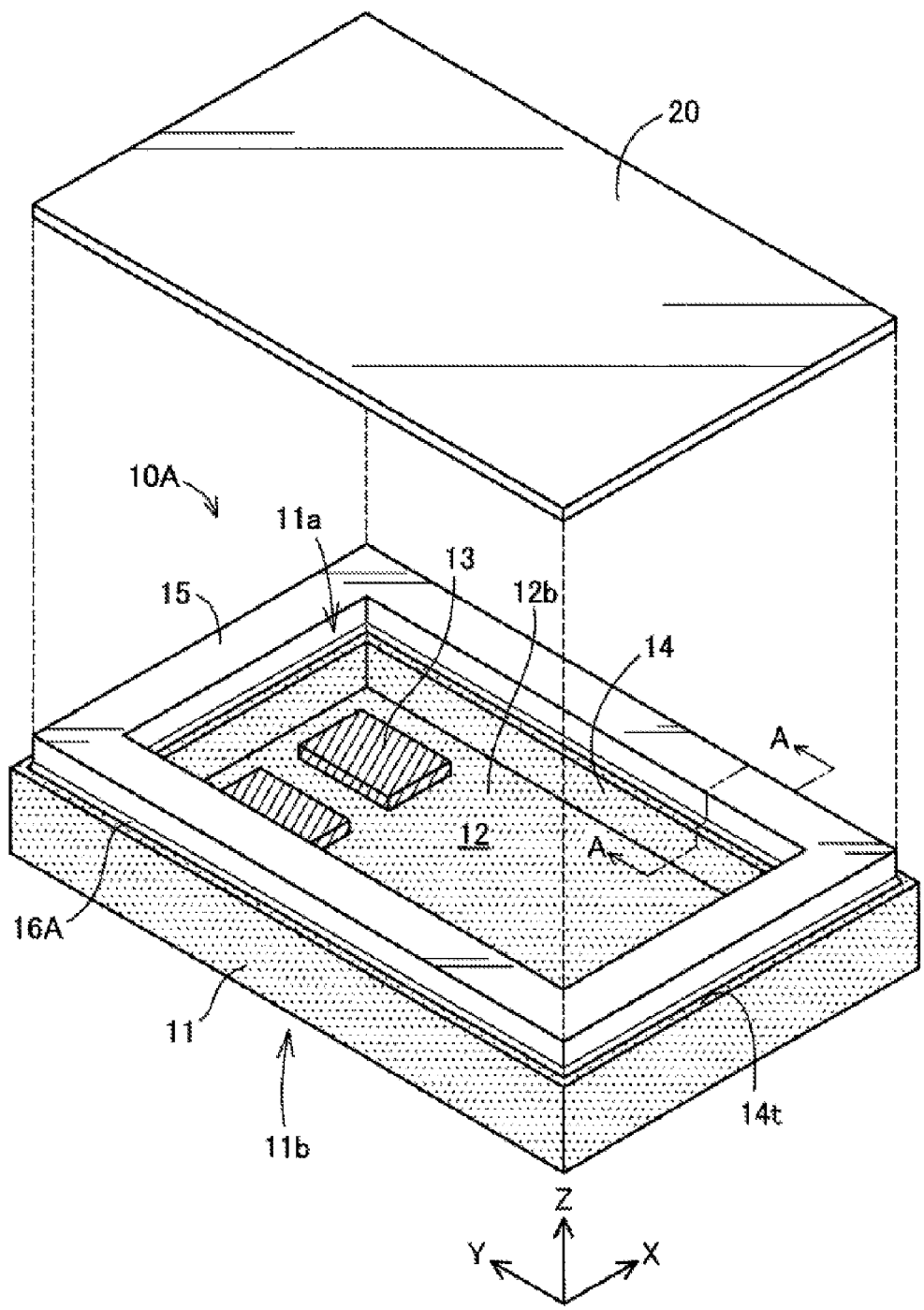
FIG. 1 is a schematic perspective view showing the configuration of a ceramic package according to a first embodiment.

FIG. 1 is a schematic perspective view showing the configuration of a ceramic package 10A according to a first embodiment of the present invention. For convenience, FIG. 1 shows a metal lid 20 to be mounted on the ceramic package 10A. In addition, FIG. 1 shows arrows X, Y, and Z indicating three directions orthogonal to each other, on the basis of the ceramic package 10A. The arrow X indicates a direction along a short side of the ceramic package 10A, the arrow Y indicates a direction along a long side of the ceramic package 10A, and the arrow Z indicates a direction along a thickness direction of the ceramic package 10A. The arrows X, Y, and Z are also shown as appropriate in each drawing to which reference is made in the present specification.

The ceramic package 10A is able to mount therein electronic components such as a quartz resonator, a semiconductor element, and a piezoelectric element. The ceramic package 10A includes a substrate portion 11 and a seal ring 15. The substrate portion 11 corresponds to a subordinate concept of a ceramic substrate in the present invention. In the present embodiment, the substrate portion 11 is formed of a substantially rectangular ceramic plate having a pair of surfaces 11a and 11b. As a ceramic material forming the substrate portion 11, for example, a ceramic material that contains alumina as a principal component and is sintered at a high temperature or a ceramic material that contains glass and is sintered at a low temperature may be used. In the present specification, the term "principal component" means a component having a weight proportion of 50% or greater to all the components.

In the first surface 11a of the substrate portion 11, a cavity 12 forming a housing space for electronic components (not shown) to be mounted in the ceramic package 10A is formed as a bottomed recess that is opened in the direction of the arrow Z. In the present embodiment, the cavity 12 is surrounded by a ceramic side wall portion 14 formed along an outer periphery of the substrate portion 11, and has an opening cross-section having a substantially rectangular shape. On a bottom surface 12b of the cavity 12, electrode pads 13 are provided to which the electronic components are to be connected. The electrode pads 13 are formed from, for example, a conductor material containing tungsten (W) or molybdenum (Mo) as a principal component.

On the second surface 11b of the substrate portion 11, terminal portions (not shown) are formed for electrically connecting to a wire of a circuit board on which the ceramic package 10A is to be mounted. In addition, within the substrate portion 11, a wiring pattern and via electrodes (not shown) that connect the electrode pads 13 to the terminal portions are formed. The terminal portions, the wiring pattern, and the via electrodes are formed from, for example, a conductor material containing W or Mo as a principal component, similarly to the electrode pads 13.

The seal ring 15 is a metallic seal member disposed on the periphery of the opening of the cavity 12. In the present embodiment, the seal ring 15 has a quadrangular frame shape provided with a substantially rectangular through hole at the center of a plate member having a substantially rectangular shape. The seal ring 15 is formed from an alloy such as 42 Alloy or Kovar, and is produced by pressing or casting. The lengths of the long side and the short side of the seal ring 15 correspond to the lengths of the long side and the short side of the substrate portion 11, the seal ring 15 is brazed to an upper end surface 14t of the side wall portion 14, which surrounds the cavity 12, and a joint portion 16A is formed at a peripheral portion of the seal ring 15. A joining method for the seal ring 15 and the configuration of the joint portion 16A will be described later.

Before the ceramic package 10A is mounted on the circuit board, the electronic components are housed and disposed within the cavity 12. The metal lid 20 that is a metallic lid member is disposed so as to cover the entire opening of the cavity 12, and seam weld is performed on the seal ring 15. The metal lid 20 is formed from, for example, Kovar or stainless steel (SUS304). In the ceramic package 10A, the cavity 12 is hermetically sealed by the metal lid 20, so that the mounted electronic components are protected.

Figure 2:
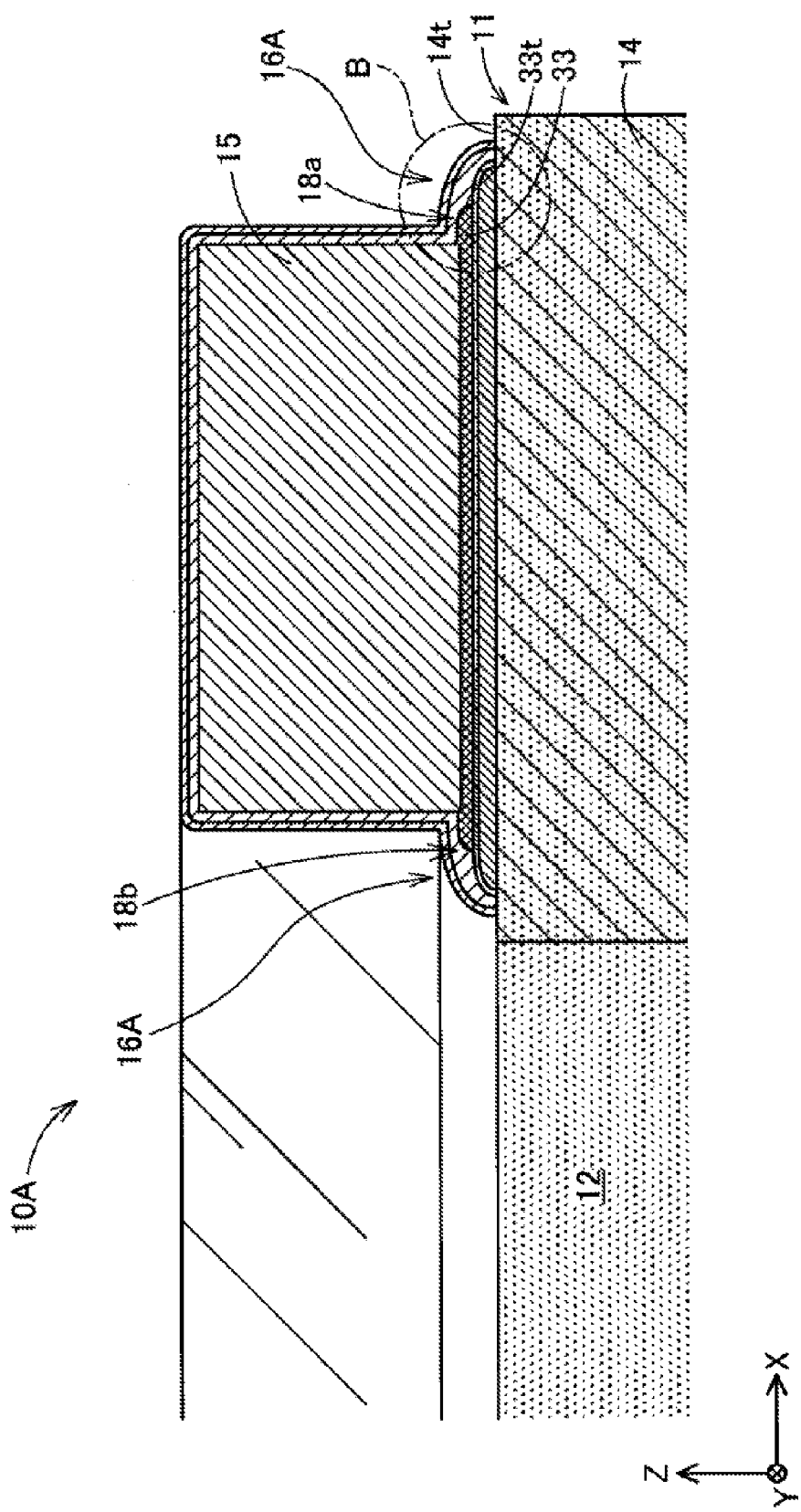
FIG. 2 is a schematic cross-sectional view showing the configuration of a joint portion of a seal ring.
Figure 3:
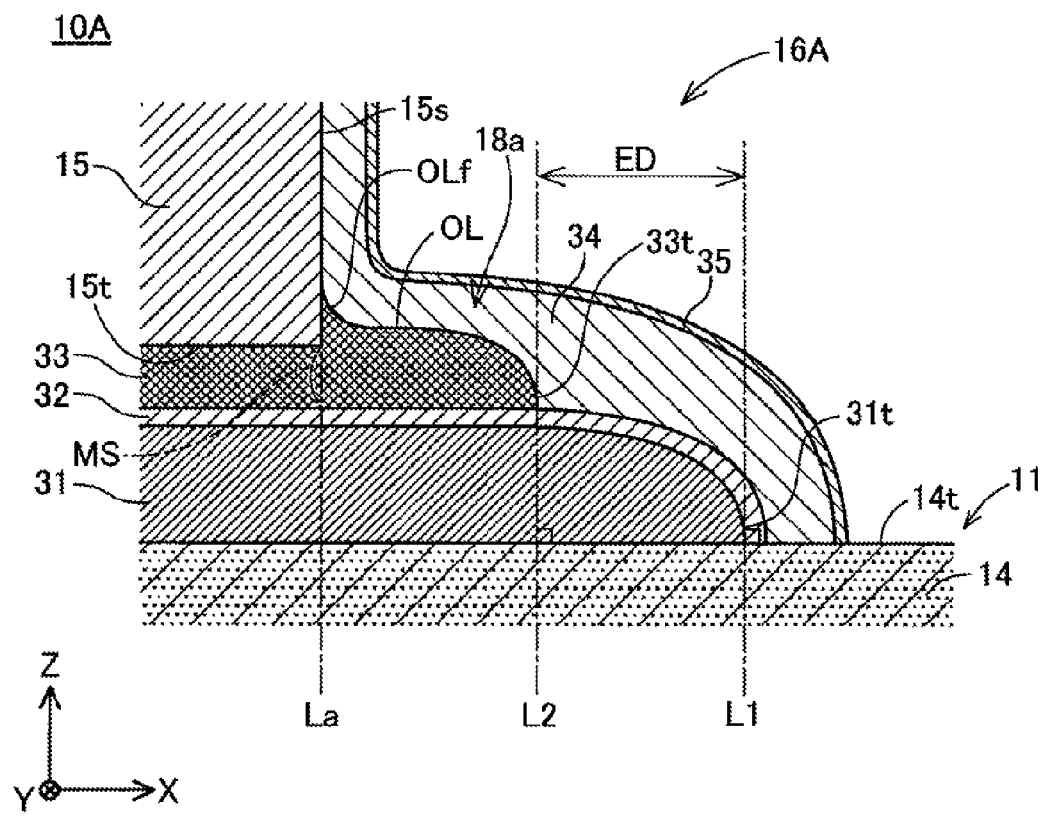
FIG. 3 is a schematic cross-sectional view showing the configuration near ends of a metallization layer and a brazing material layer.

The configuration of the joint portion 16A of the seal ring 15 in the ceramic package 10A will be described with reference to FIGS. 2 and 3. FIG. 2 is a schematic cross-sectional view showing the configuration of the joint portion 16A of the seal ring 15. FIG. 2 shows a schematic cross-section of the ceramic package 10A taken along A-A shown in FIG. 1. FIG. 3 is a schematic cross-sectional view showing the configuration near ends 31t and 33t of a metallization layer 31 and a brazing material layer 33. FIG. 3 shows a region B shown in FIG. 2. The region B includes an outer peripheral portion 18a of the brazing material layer 33. In the present embodiment, the outer peripheral portion 18a and an inner peripheral portion 18b of the brazing material layer 33 have the same configuration, and the following description for the outer peripheral portion 18a also applies to the configuration of the inner peripheral portion 18b. The cross-sections shown in FIGS. 2 and 3 correspond to cross-sections taken along a lamination direction of the metallization layer 31 and the brazing material layer 33.

In the ceramic package 10A, the metallization layer 31 is formed on the upper end surface 14t of the side wall portion 14 of the substrate portion 11. The seal ring 15 is joined to the metallization layer 31 via the brazing material layer 33. More details are as follows.

The metallization layer 31 is a metal thin film layer and contains, for example, W or Mo as a principal component. The metallization layer 31 is formed so as to surround the periphery of the cavity 12, which is a region for mounting electronic elements, when the ceramic package 10A is seen in a plan view, that is, when the ceramic package 10A is seen along the direction of the arrow Z. The surface of the metallization layer 31 is covered with a first plating layer 32. The first plating layer 32 has a function to enhance wettability of a brazing material forming the brazing material layer 33, and is formed of, for example, a nickel (Ni) plating layer.

The brazing material layer 33 is a thin film layer of the brazing material, and is formed on the metallization layer 31 via the first plating layer 32. The brazing material layer 33 is formed from a brazing material containing, as a principal component, a metal that is electrochemically nobler than the metal that is the principal component of the metallization layer 31. In the present embodiment, the brazing material layer 33 is formed from a silver brazing alloy containing, as a principal component, silver (Ag), which is nobler than W and Mo. Similarly to the metallization layer 31, the brazing material layer 33 is formed so as to surround the periphery of the cavity 12.

In the ceramic package 10A, further, a second plating layer 34 is formed so as to cover the seal ring 15, the brazing material layer 33, and the first plating layer 32, and a third plating layer 35 is formed so as to cover the second plating layer 34. Similarly to the first plating layer 32, the second plating layer 34 is formed of, for example, an Ni plating layer. The third plating layer 35 is formed of, for example, a gold (Au) plating layer.

In the ceramic package 10A of the present embodiment, the end 33t of the brazing material layer 33 is located outside a region directly below the seal ring 15 at each of: the inner peripheral portion 18b, which is an edge portion at the inner peripheral side (cavity 12 side) of the brazing material layer 33; and the outer peripheral portion 18a, which is an edge portion at the outer peripheral side opposite to the inner peripheral side. In FIG. 3, the boundary line between the inner side and the outer side of the region directly below the seal ring 15 is shown by an alternate long and short dash line La. When brazing is performed in a state where the end 33t of the brazing material layer 33 is located in the region directly below the seal ring 15, there is a possibility that a meniscus curved surface MS of the brazing material layer 33 is formed between the first plating layer 32 and a bottom surface 15t of the seal ring 15 as shown by a broken line. When such a meniscus curved surface MS is formed, stress concentration easily occurs from the curved surface MS, so that the joining strength of the seal ring 15 by the brazing material layer 33 decreases. On the other hand, in the ceramic package 10A of the present embodiment, the end 33t of the brazing material layer 33 is located outside the region directly below the seal ring 15 as described above, and formation of a meniscus at the end 33t of the brazing material layer 33 as described above is suppressed. Therefore, a decrease in the joining strength of the seal ring 15 by the brazing material layer 33 is suppressed.

In the ceramic package 10A of the present embodiment, the brazing material layer 33 is in contact with the bottom surface 15t and the lower end of a side surface 15s of the seal ring 15 at each of the outer peripheral portion 18a and the inner peripheral portion 18b. Thus, the joining area between the brazing material layer 33 and the seal ring 15 is increased, and the joining strength of the seal ring 15 by the brazing material layer 33 is enhanced. A contour line OL of each of the outer peripheral portion 18a and the inner peripheral portion 18b of the brazing material layer 33 has an end portion OLf forming a curved line that extends downward from the side surface 15s of the seal ring 15 and is convex downward. By having such the end portion OLf, stress generated in the brazing material layer 33 can be easily released to the outer side, and high joining strength of the seal ring 15 by the brazing material layer 33 can be obtained.

Furthermore, in the ceramic package 10A of the present embodiment, the end 33*t* of the brazing material layer 33 at each of the outer peripheral portion 18*a* and the inner peripheral portion 18*b* is located inward (at the seal ring 15 side) of the end 31*t* of the metallization layer 31 at the same side with respect to the seal ring 15. As described above, in the ceramic package 10A of the present embodiment, the end 31*t* of the metallization layer 31 and the end 33*t* of the brazing material layer 33 are formed at positions spaced apart from each other. The reason for this will be described later.

An inter-end distance ED that is the distance between the end 31*t* of the metallization layer 31 and the end 33*t* of the brazing material layer 33 is desirably equal to or greater than 0.020 mm. The inter-end distance ED corresponds to the distance between: a first virtual perpendicular line L1 that is tangent to the end 31*t* of the metallization layer 31 and perpendicularly intersects the upper end surface 14*t*; and a second virtual perpendicular line L2 that is tangent to the end 33*t* of the brazing material layer 33 and perpendicularly intersects the upper end surface 14*t*. The inter-end distance ED is positive when the second virtual perpendicular line L2 is closer to the seal ring 15 than the first virtual perpendicular line L1, and is negative when the second virtual perpendicular line L2 is farther from the seal ring 15 than the first virtual perpendicular line L1.

Furthermore, in the present embodiment, the first plating layer 32 has a thickness of not less than 1.5 µm and not greater than 5 µm. In addition, the second plating layer 34 has a thickness of not less than 1.5 µm and not greater than 5 µm. In the present specification, the thickness of the first plating layer 32 means the thickness of a portion interposed between the metallization layer 31 and the brazing material layer 33, and the thickness of the second plating layer 34 means the thickness of a portion located on the brazing material layer 33. The reason why the first plating layer 32 and the second plating layer 34 have the thicknesses as described above will be described later.

Process for Producing Ceramic Package

Figure 4:
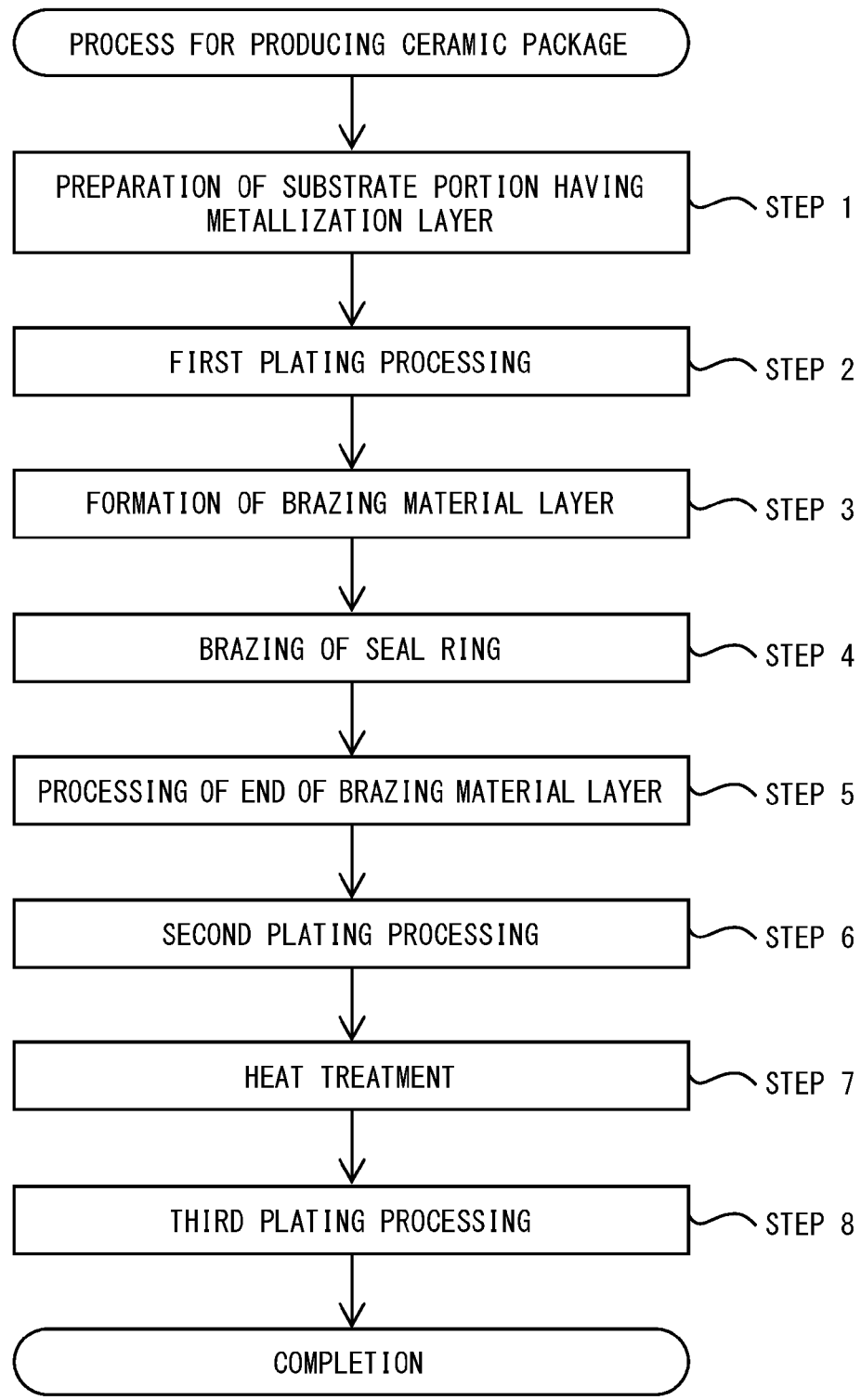
FIG. 4 is a process flowchart showing a process for producing the ceramic package according to the first embodiment.

FIG. 4 is a process flowchart showing a process for producing the ceramic package 10A. In step 1, the substrate portion 11 having the metallization layer 31 formed thereon is prepared. Specifically, first, a plurality of green sheets having a substantially rectangular shape and the same size are produced by forming a ceramic slurry obtained by blending alumina powder, a binder resin, and a solvent, etc., into a sheet shape by a doctor blade method.

Then, unsintered wiring portions that form the electrode pads 13, the terminal portions, the wiring pattern, and the via electrodes, etc. after sintering are formed in some of the green sheets by using an unsintered conductor paste containing Mo or W as a principal component. A substantially rectangular through hole that forms the cavity 12 is formed at the center of each of the other green sheets by punching.

Next, the frame-like green sheet having the through hole formed therein is stacked on the plate-like green sheet having the unsintered wiring portions formed therein, and is pressure-bonded with a predetermined load, to produce a green sheet laminate that forms the substrate portion 11. A conductor paste containing Mo or W as a principal component is applied by screen print or the like to the periphery of the opening of the recess that forms the cavity 12, and then the green sheet laminate is sintered at a predetermined sintering temperature. Accordingly, the substrate portion 11 having the metallization layer 31 formed at the periphery of the cavity 12 is obtained. Step 1 corresponds to a subordinate concept of a metallization layer forming step in the present invention.

In step 2, the first plating layer 32 is formed so as to cover the surface of the metallization layer 31 by first plating processing. In the present embodiment, electrolytic nickel plating is performed as the first plating processing. In the first plating processing, an electric current value is adjusted such that the first plating layer 32 has a thickness of not less than 1.5 µm and not greater than 5 µm as described above. Step 2 corresponds to a subordinate concept of a first plating step in the present invention.

In step 3, the brazing material in a melted state is supplied so as to wet and spread on the entire surface of the first plating layer 32, whereby the brazing material layer 33 is formed. Step 3 corresponds to a subordinate concept of a brazing material layer forming step in the present invention. In step 4, the seal ring 15 is placed at a predetermined position on the brazing material layer 33, and the brazing material layer 33 is solidified. Accordingly, the seal ring 15 is brazed to the substrate portion 11. Step 4 corresponds to a subordinate concept of a joining step in the present invention. In step 5, by etching, the end 33*t* of the brazing material layer 33 is adjusted so as to be located inward of the end 31*t* of the metallization layer 31. Step 5 corresponds to a subordinate concept of an end adjusting step in the present invention.

In step 6, the second plating layer 34 is formed by second plating processing. In the present embodiment, electrolytic nickel plating is performed as the second plating processing. Step 6 corresponds to a subordinate concept of a second plating step in the present invention. In step 7, a heat treatment is performed in which the entire substrate portion 11 having the second plating layer 34 formed thereon is heated at approximately 500° C. to 1000° C. in a reducing atmosphere. By the heat treatment, the adhesiveness of each of the first plating layer 32 and the second plating layer 34 to the base is enhanced. Step 7 corresponds to a subordinate concept of a heating step in the present invention. Furthermore, in step 8, the third plating layer 35 is formed by third plating processing. Through the above steps, the ceramic package 10A is completed.

Effect of Suppressing Deterioration at Joint Portion of Seal Ring

The inventors of the present invention have obtained the following finding through research for a brazed joint portion. When the brazed joint portion is exposed to a high-temperature and high-humidity environment (e.g., air temperature: 60° C. or higher, relative humidity: 90% or higher) for a long period of time, the metal component of the metallization layer partially melts out to the outside in some cases. This is inferred to be because, since the principal component of the brazing material layer is electrochemically nobler than the principal component of the metallization layer, a local battery having the metallization layer and the brazing material layer as electrodes is formed, and an electrical driving force of the local battery promotes melting-out of the principal component of the metallization layer. Such melting-out of the metal component in the ceramic package causes a decrease in electrical insulation properties such as short-circuit or leak of an electric current, which causes the electrical characteristics of a packaged electronic component to deteriorate.

As described above, in the ceramic package 10A of the present embodiment, the end 33*t* of the brazing material layer 33 is located inward of the end 31*t* of the metallization layer 31, and the end 31t of the metallization layer 31 and the end 33t of the brazing material layer 33 are formed so as to be spaced apart from each other (FIG. 3). Thus, formation of a local battery between the metallization layer 31 and the brazing material layer 33 as described above is suppressed, so that melting-out of the metal component from the metallization layer 31 is suppressed. Particularly, in the ceramic package 10A of the present embodiment, since the inter-end distance ED is equal to or greater than 0.020 mm, melting-out of the metal component from the metallization layer 31 is suppressed at a higher level.

Moreover, in the ceramic package 10A of the present embodiment, the first plating layer 32 has a thickness of not less than 1.5 μm at least at the portion between the metallization layer 31 and the brazing material layer 33. Thus, the metallization layer 31 and the brazing material layer 33 are spaced apart from each other by a distance equal to the thickness of the first plating layer 32. Therefore, formation of a local battery as described above is further suppressed, so that melting-out of the metal component from the metallization layer 31 is suppressed. In addition, since the thickness of the first plating layer 32 at the portion between the metallization layer 31 and the brazing material layer 33 is equal to or less than 5 μm, a decrease in joinability of the seal ring 15 caused due to the first plating layer 32 being excessively thick is suppressed.

In the ceramic package 10A of the present embodiment, the second plating layer 34 has a thickness of not less than 1.5 μm at least at the portion on the brazing material layer 33. Thus, the sealability of the brazing material layer 33 is enhanced, so that melting-out of the metal component from the brazing material layer 33 is suppressed. In addition, the metallization layer 31 and the third plating layer 35 are spaced apart from each other by a distance equal to the thickness of the second plating layer 34. Thus, formation of a local battery having the metallization layer 31 and the third plating layer 35 as electrodes is suppressed, so that melting-out of the metal component from the metallization layer 31 is suppressed. Moreover, since the thickness of the second plating layer 34 is equal to or less than 5 μm, an increase in the size of the joint portion 16A is suppressed.

In addition, in the ceramic package 10A of the present embodiment, the heat treatment is performed after the second plating layer 34 is formed, so that the adhesiveness and sealability of the first plating layer 32 and the second plating layer 34 to the base are enhanced. Therefore, melting-out of the metal component of the metallization layer 31 or the brazing material layer 33 is further suppressed.

As described above, in the ceramic package 10A according to the first embodiment, even in the case of exposure to a high-temperature and high-humidity environment for a long period of time, occurrence of deterioration at the joint portion 16A of the seal ring 15 is suppressed.

B. Second Embodiment

Figure 5:
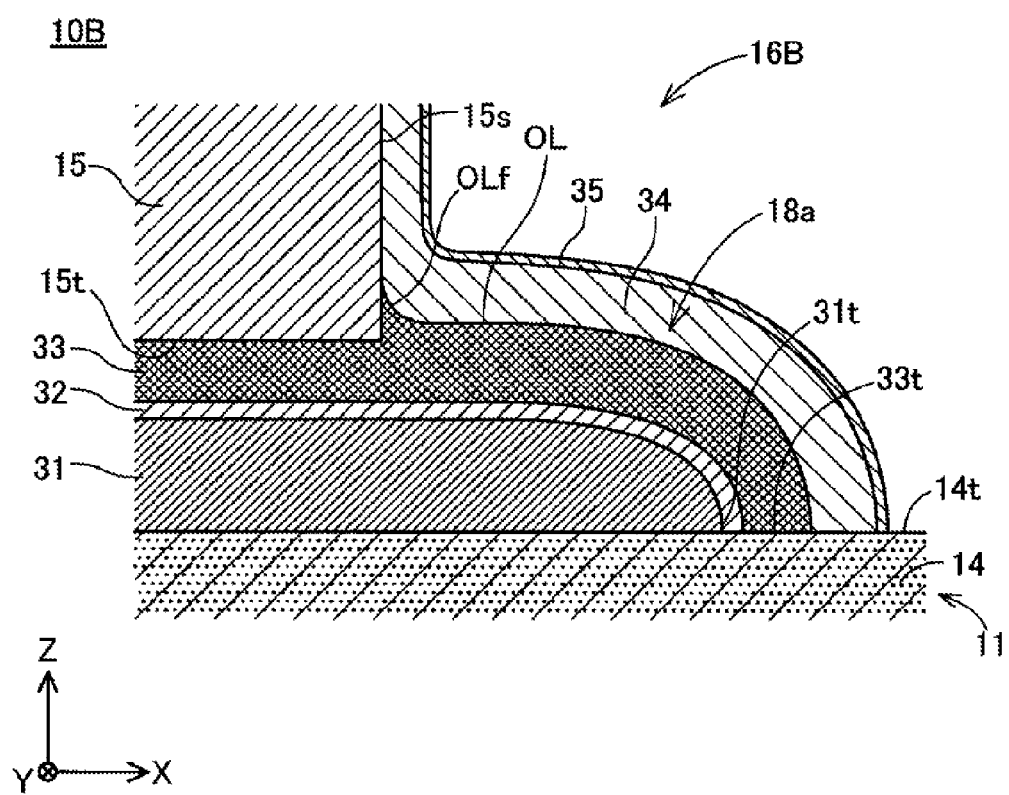
FIG. 5 is a schematic cross-sectional view showing the configuration of a joint portion of a seal ring according to a second embodiment.

FIG. 5 is a schematic cross-sectional view showing the configuration of a joint portion 16B at the periphery of a seal ring 15 according to a second embodiment of the present invention. The configuration of a ceramic package 10B of the second embodiment is substantially the same as the configuration of the ceramic package 10A of the first embodiment, except that the configuration of the joint portion 16B of the seal ring 15 is different. In the joint portion 16B of the seal ring 15 according to the second embodiment, the end 33t of the brazing material layer 33 is located at a position farther from the seal ring 15 than the end 31t of the metallization layer 31, and is in contact with the upper end surface 14t of the side wall portion 14. In addition, an end portion of the second plating layer 34 is not in contact with the first plating layer 32. Moreover, the contour line OL of each of the outer peripheral portion 18a and the inner peripheral portion 18b of the brazing material layer 33 has an end portion OLf that is the same as described in the first embodiment.

Figure 6:
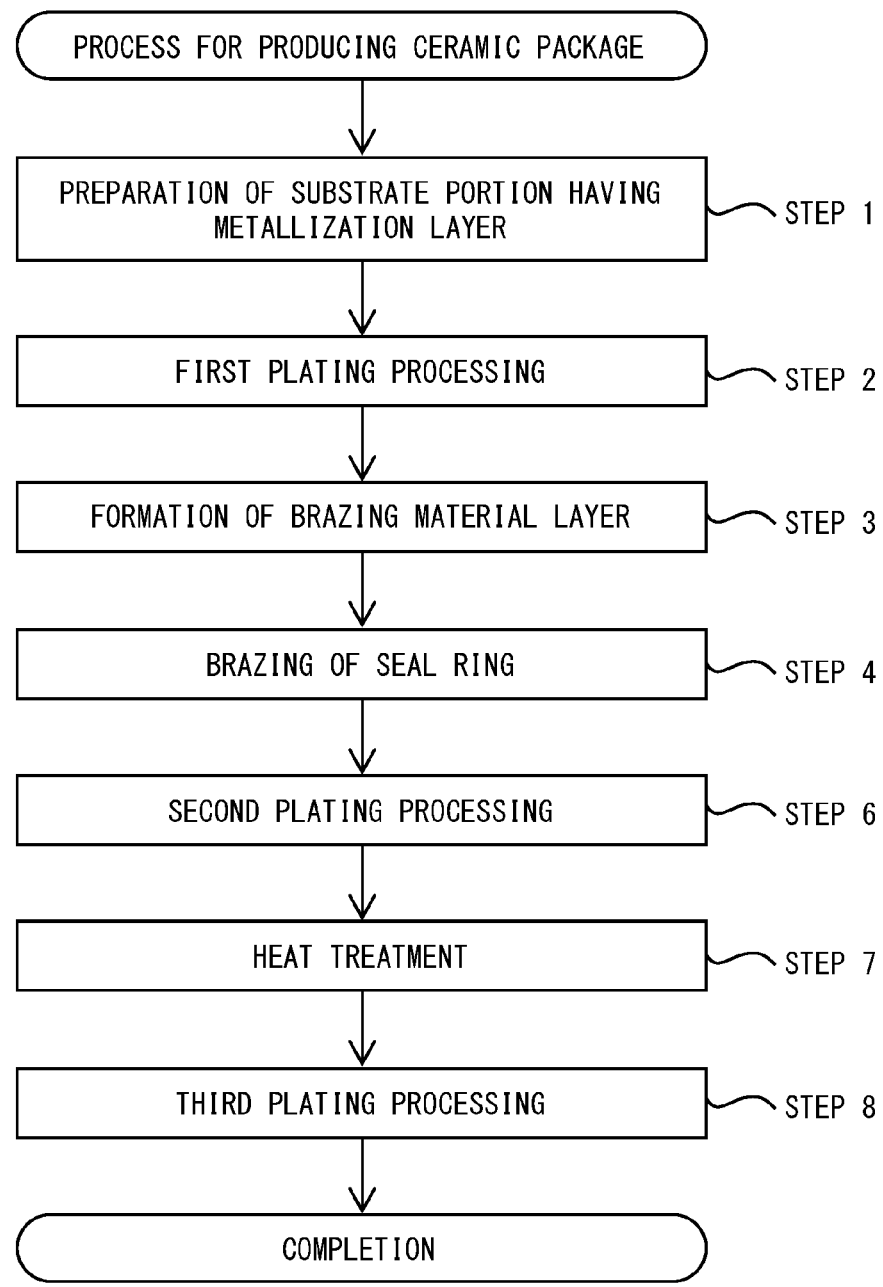
FIG. 6 is a process flowchart showing a process for producing a ceramic package according to the second embodiment.

FIG. 6 is a process flowchart showing a process for producing the ceramic package 10B according to the second embodiment. The process for producing the ceramic package 10B according to the second embodiment is substantially the same as the process for producing the ceramic package 10A according to the first embodiment, except that step 5 is omitted. That is, in the second embodiment, the second plating layer 34 is formed (step 6) without adjusting the position of the end of the brazing material layer 33 formed in step 3. However, after the second plating layer 34 is formed, a heat treatment is executed (step 7) similarly as in the first embodiment.

As described above, in the ceramic package 10B of the second embodiment, in the joint portion 16B of the seal ring 15, the brazing material layer 33 extends to a region outside the metallization layer 31, and the end 33t of the brazing material layer 33 is in contact with the upper end surface 14t of the side wall portion 14. Even with such a configuration, since the heat treatment (step 7 in FIG. 6) is executed in the production process, the adhesiveness and the sealability of the first plating layer 32 and the second plating layer 34 to the base are enhanced. Therefore, melting-out of the metal component from the metallization layer 31 or the brazing material layer 33 is suppressed, and deterioration of the joint portion 16B in a high-temperature and high-humidity environment is suppressed.

C. Third Embodiment

Figure 7:
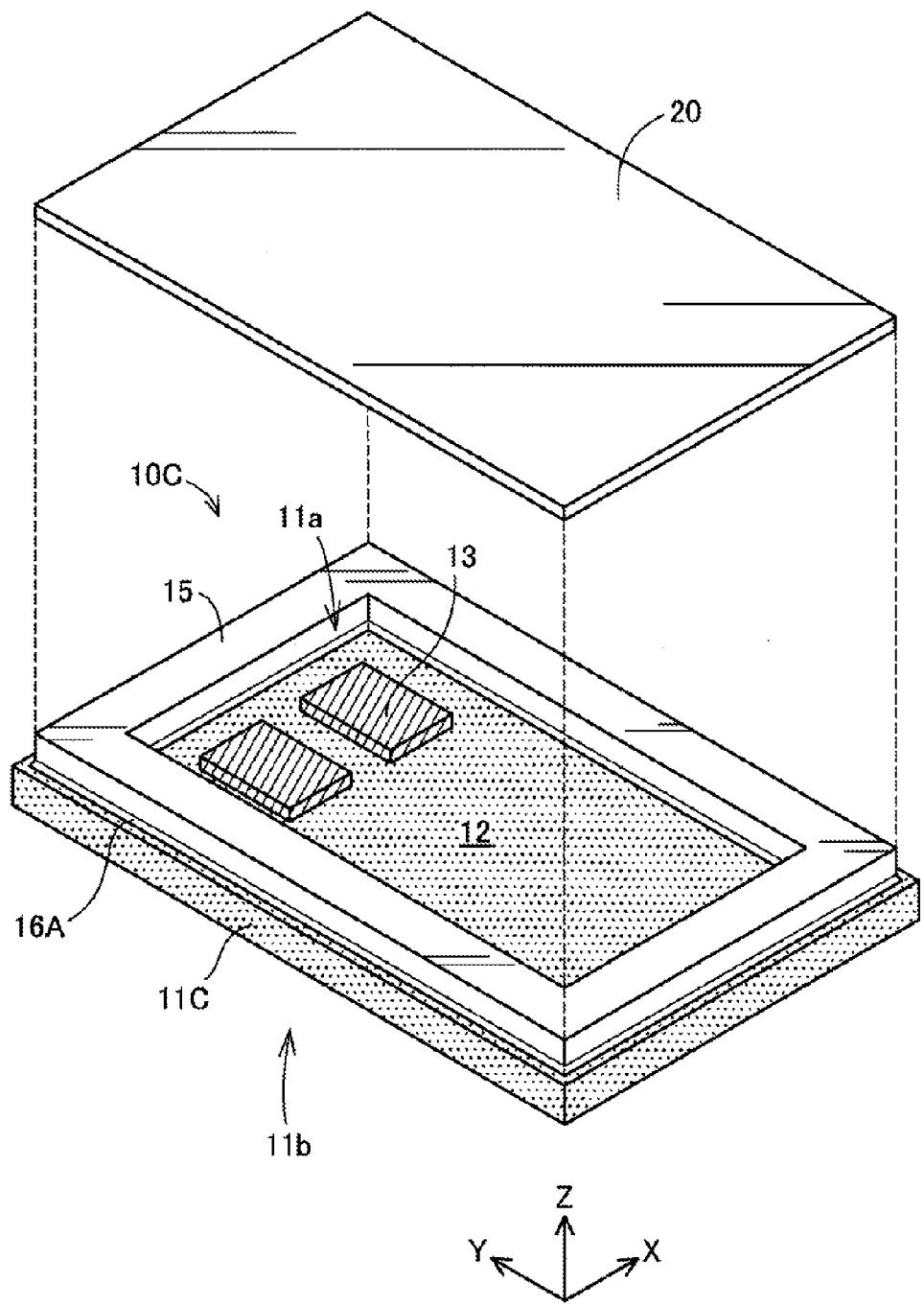
FIG. 7 is a schematic perspective view showing the configuration of a ceramic package according to a third embodiment.

FIG. 7 is a schematic perspective view showing the configuration of a ceramic package 10C according to a third embodiment. The configuration of the ceramic package 10C of the third embodiment is substantially the same as that of the ceramic package 10A of the first embodiment, except that the side wall portion 14 is not provided in a substrate portion 11C. The substrate portion 11C of the third embodiment is formed of a flat ceramic plate having a substantially rectangular shape, and does not have a recess. In the ceramic package 10C of the third embodiment, the cavity 12 is formed within the frame shape of the seal ring 15, and the seal ring 15 forms a side wall portion that surrounds the periphery of the cavity 12.

In the ceramic package 10C of the third embodiment, on a first surface 11a of the substrate portion 11C, a joint portion 16A of the seal ring 15 that is the same as described in the first embodiment is formed so as to surround the periphery of a region where electronic components are mounted. Even in the ceramic package 10C of the third embodiment, similarly to the ceramic package 10A of the first embodiment, occurrence of deterioration at the joint portion 16A of the seal ring 15 is suppressed. In addition, with the ceramic package 10C of the third embodiment, various advantageous effects that are the same as described in the first embodiment can be achieved.

D. Experimental Examples

D1. Experimental Example 1

FIG. 8 is an explanatory diagram showing test results of an environmental test in Experimental Example 1. In Experimental Example 1, a constant temperature and humidity test (HHT) was performed on samples S10 to S17 of the ceramic package 10A of the first embodiment. The samples S10 to S17 were produced so as to have the substantially same configuration except that the inter-end distance ED (FIG. 3) was different. The main constituent materials of the samples S10 to S17 are as follows.

Main Constituent Materials of Sampler S10 to S17
Principal component of metallization layer: W
Principal component of brazing material layer: Ag
Principal components of first plating layer and second plating layer: Ni
Principal component of third plating layer: Au As each of the samples S10 to S17, 20 samples were produced, and the constant temperature and humidity test was performed on each sample under the following conditions.

Test Conditions of Constant Temperature and Humidity Test
Temperature: 60° C., relative humidity: 90%RH The table in FIG. 8 shows, for each of the samples S10 to S17, the number of samples in which melting-out of W was observed even slightly on the appearance after elapse of each specified time (70 hours, 216 hours, 312 hours, 480 hours, 1056 hours) from start of the test. In the samples S10 to S13 having an inter-end distance ED of less than 0.020 mm, melting-out of W was observed after elapse of 312 hours or 480 hours after the start of the test. Meanwhile, in each of the samples S14 to S17 having an inter-end distance ED of not less than 0.020 mm, melting-out of W was not observed during the test. From this, it is recognized that the inter-end distance ED is desirably equal to or greater than 0.020 mm, in order to suppress melting-out of W from the metallization layer. Since the inter-end distance ED of the sample S14 is 0.024 mm, the inter-end distance ED is more desirably equal to or greater than 0.024 mm.

D2. Experimental Example 2

FIG. 9 is an explanatory diagram showing test results of an environmental test in Experimental Example 2. In Experimental Example 2, a constant temperature and humidity test was performed on various samples S20 to S25 described below. The outlines of the samples S20 to S25 are as follows.

Sample S20: The configuration is the same as that of the ceramic package 10B described in the second embodiment, the thickness of the first plating layer 32 is 1.2 μm, and the thickness of the second plating layer 34 is 2.5 μm. However, the heat treatment in step 7 was not performed in the production process.

Sample S21: The configuration is the same as that of the sample S20 except that the thickness of the first plating layer 32 is 1.7 μm.

Sample S22: The configuration is the same as that of the sample S20 except that the thickness of the second plating layer 34 is 4.0 μm.

Sample S23: The configuration is the same as that of the sample S21 except that the heat treatment in step 7was performed in the production process.

Sample S24: The configuration is the same as that of the ceramic package 10A described in the first embodiment, the thickness of the first plating layer 32 is 1.2 μm, and the thickness of the second plating layer 34 is 2.5 μm. In addition, the inter-end distance ED is 0.024 mm. However, the heat treatment in step 7 was not performed in the production process.

Sample S25: The configuration is the same as that of the sample S24 except that the heat treatment in step 7was performed in the production process.

The main constituent materials of the samples S20 to S25 are as follows.

Maim Constituent Materials of Samples S20 to S25
Principal component of metallization layer: W
Principal component of brazing material layer: Ag
Principal components of first plating layer and second plating layer: Ni
Principal component of third plating layer: Au As each of the samples S20 to S25, 20 samples were produced, and the constant temperature and humidity test was performed on each sample under the following conditions. In Experimental Example 2, the environmental humidity was higher than that in the constant temperature and humidity test described with reference to FIG. 8, and thus test times were shortened.

Test Conditions of Constant Temperature and Humidity Test
Temperature: 60° C., relative humidity: 93%RH The cells at the right side of the table in FIG. 9 show, for each of the samples S20 to S25, the number of samples in which significant melting-out of W was observed to such a degree that W grew into a foreign-matter-like lump, after elapse of each specified time (75 hours, 480 hours, 1000 hours) after start of the test. The following is recognized from the table in FIG. 9.

When the sample S20 and the sample S21 are compared to each other, it is recognized that melting-out of W is suppressed more in the sample S21 in which the thickness of the first plating layer 32 is larger. In addition, when the sample S20 and the sample S22 are compared to each other, it is recognized that melting-out of W is suppressed more in the sample S22 in which the thickness of the second plating layer 34 is larger. As described above, as the thicknesses of the first plating layer 32 and the second plating layer 34 are larger, melting-out of the metal component from the metallization layer can be suppressed more. In addition, each of the thicknesses of the first plating layer 32 and the second plating layer 34 is desirably equal to or greater than 1.2 μm, and particularly, the thickness of the second plating layer 34 is more desirably equal to or greater than 2.5 μm.

When the sample S20 and the sample S23 are compared to each other, melting-out of W is suppressed more in the sample S23 in which the heat treatment in step 7 was performed. In addition, in the sample S25, the heat treatment in step 7 was performed, and melting-out of W was suppressed. From these results, it is recognized that melting-out of the metal component from the metallization layer is suppressed by the heat treatment after the second plating processing.

Each of the sample S24 and the sample S25 has the same configuration as that of the ceramic package 10A of the first embodiment, and the inter-end distance ED thereof is 0.024 mm. It is recognized that when the end 33t of the brazing material layer 33 is located inward of the end 31t of the metallization layer 31 and the inter-end distance ED is set to 0.024 mm as described above, melting-out of the metal component from the metallization layer can be suppressed at a high level.

As described above, from the results of Experimental Examples 1 and 2, it is recognized that even when the joint portion 16A or 16B described above in each embodiment is exposed to a high-temperature and high-humidity environment for a long period of time, deterioration of the joint portion 16A or 16B is suppressed.

E. Modified Embodiments

E1. Modified Embodiment 1

In the above-described first embodiment, the end 33t is located inward of the end 31t of the metallization layer 31 at each of the outer peripheral portion 18a and the inner peripheral portion 18b of the brazing material layer 33. On the other hand, the end 33t of the brazing material layer 33 only needs to be located inward of the end 31*t* of the metallization layer 31 at least one of the outer peripheral portion 18*a* and the inner peripheral portion 18*b*. Even with such a configuration, the joining strength can be enhanced at the side where the end 33*t* of the brazing material layer 33 is located inward of the end 31*t* of the metallization layer 31.

E2. Modified Embodiment 2

In the production process of the above-described first embodiment, after the second plating layer 34 is formed in step 6, the heat treatment is performed in step 7 (FIG. 4). On the other hand, the heat treatment in step 7 may be omitted in the production process of the first embodiment. Even in this case, since the position of the end 33*t* of the brazing material layer 33 is adjusted in step 5, melting-out of the metal component from the metallization layer 31 is suppressed to no small extent.

E3. Modified Embodiment 3

In the ceramic packages 10A to 10C of the respective embodiments described above, the second plating layer 34 and the third plating layer 35 are formed in addition to the first plating layer 32. On the other hand, in the ceramic packages 10A and 10C of the first embodiment and the third embodiment having the joint portion 16A, both the second plating layer 34 and the third plating layer 35 may be omitted, or only the third plating layer 35 may be omitted. In addition, in the ceramic package 10B of the above-described second embodiment having the joint portion 16B, the third plating layer 35 may be omitted.

E4. Modified Embodiment 4

In step 5 of each embodiment described above, the position of the end 33*t* of the brazing material layer 33 is adjusted by etching. On the other hand, in step 5, the position of the end 33*t* of the brazing material layer 33 may be adjusted by processing other than etching. For example, the position of the end 33*t* of the brazing material layer 33 may be adjusted by cutting or grinding.

E5. Modified Embodiment 5

The ceramic package 10C of the above-described third embodiment has the same joint portion 16A as described in the first embodiment. On the other hand, the ceramic package 10C may have a joint portion 16B formed by the same production process as described in the second embodiment, instead of the joint portion 16A of the first embodiment.

E6. Modified Embodiment 6

In the above-described first and third embodiments, the end 33*t* of the brazing material layer 33 is located outside the region directly below the seal ring 15 at each of the outer peripheral portion 18*a* and the inner peripheral portion 18*b*. On the other hand, the end 33*t* of the brazing material layer 33 only needs to be located outside the region directly below the seal ring 15 at least one of the outer peripheral portion 18*a* and the inner peripheral portion 18*b*. Even with such a configuration, the joining strength of the seal ring 15 by the brazing material layer 33 can be enhanced to no small extent in the region where the end 33*t* of the brazing material layer 33 is located outside the region directly below the seal ring 15.

E7. Modified Embodiment 7

In each embodiment described above, the brazing material layer 33 is in contact with the bottom surface 15*t* and the lower end of the side surface 15*s* of the seal ring 15 at both the outer peripheral portion 18*a* and the inner peripheral portion 18*b* thereof. On the other hand, the brazing material layer 33 may not be in contact with the bottom surface 15*t* and the lower end of the side surface 15*s* of the seal ring 15 at both the outer peripheral portion 18*a* and the inner peripheral portion 18*b*. The brazing material layer 33 only needs to be formed so as to be in contact with the bottom surface 15*t* and the lower end of the side surface 15*s* of the seal ring 15 at least one of the outer peripheral portion 18*a* and the inner peripheral portion 18*b*. Even with such a configuration, the joining strength of the seal ring 15 can be enhanced. In addition, in each embodiment described above, each of the contour lines OL of the outer peripheral portion 18*a* and the inner peripheral portion 18*b* of the brazing material layer 33 which appear in the cross-section along the lamination direction of the brazing material layer 33 and the metallization layer 31 has the end portion OLf. On the other hand, only the contour line OL of at least one of the outer peripheral portion 18*a* and the inner peripheral portion 18*b* of the brazing material layer may have the end portion OLf. Even with such a configuration, the joining strength of the seal ring 15 can be enhanced further.

The present invention is not limited to the embodiments, examples, and modified embodiments described above, and can be embodied in various configurations without departing from the gist of the present invention. For example, the technical features in the embodiments, examples, and modified embodiments corresponding to the technical features in each aspect described in the Summary of the Invention section can be appropriately replaced or combined to solve part or all of the foregoing problems, or to achieve some of or all of the foregoing effects. Further, such technical features can be appropriately deleted if not described as being essential in the present specification.

DESCRIPTION OF REFERENCE NUMERALS

10A to 10C: ceramic package
11, 11C: substrate portion
11*a*: first surface
11*b*: second surface
12: cavity
12*b*: bottom surface
13: electrode pad
14: side wall portion
14*t*: upper end surface
15: seal ring
16A, 16B: joint portion
18*a*: outer peripheral portion
18*b*: inner peripheral portion
20: metal lid
31: metallization layer
31*t*: end
32: first plating layer
33: brazing material layer
33*t*: end
34: second plating layer
35: third plating layer

What is claimed is:

1. A ceramic package comprising:
   a ceramic substrate having a surface;
   a metallization layer disposed along an outer periphery of a predetermined region on the surface of the ceramic substrate;
   a first plating layer disposed on the metallization layer;
   a brazing material layer disposed on the metallization layer with the first plating layer interposed therebetween; and
   a seal member joined on the metallization layer via the brazing material layer, wherein
   in at least one of an outer peripheral portion and an inner peripheral portion of the brazing material layer, an end of the brazing material layer is located outside a region directly below the seal member and the end of the brazing material layer is positioned at least 0.02 mm nearer to the seal member than an end of the metallization layer.

2. The ceramic package according to claim 1, wherein at least a portion of the first plating layer that is interposed between the metallization layer and the brazing material layer has a thickness of not less than 1.5 µm and not greater than 5 µm.

3. The ceramic package according to claim 1, further comprising a second plating layer formed on the brazing material layer such that at least one of an outer peripheral end and an inner peripheral end of the second plating layer is in contact with the first plating layer, and at least a portion of the second plating layer that is located on the brazing material layer has a thickness of not less than 1.5 µm and not greater than 5 µm.

4. The ceramic package according to claim 1, wherein
a wall portion defines a cavity that opens in one direction at the surface of the ceramic substrate, the wall portion surrounding the predetermined region, and
the metallization layer is formed on an upper end surface of the wall portion surrounding the cavity.

5. The ceramic package according to claim 1 wherein in at least one of the outer peripheral portion and the inner peripheral portion of the brazing material layer, the brazing material layer is in contact with a bottom surface of the seal member and a lower end of a side surface of the seal member.

6. The ceramic package according to claim 5, wherein in a cross-section along a lamination direction of the brazing material layer and the metallization layer, a contour line of at least one of the outer peripheral portion and the inner peripheral portion of the brazing material layer has an end portion forming a curved line that extends downward from the side surface of the seal member and is convex downward.

7. A method for producing the ceramic package according to claim 1, the method comprising:
a metallization layer forming step of forming the metallization layer along the outer periphery of the predetermined region on the surface of the ceramic substrate;
a first plating step of forming the first plating layer on the metallization layer;
a brazing material layer forming step of forming the brazing material layer on the metallization layer via the first plating layer;
a joining step of brazing the seal member to the metallization layer via the brazing material layer;
a second plating step of forming a second plating layer on the brazing material layer after the joining step; and
a heating step of heating the ceramic substrate at a temperature of 500° C. or higher after the second plating step.

8. The method according to claim 7, further comprising an end adjusting step of processing the end of the brazing material layer before the second plating step such that at least one of an outer peripheral end and an inner peripheral end of the brazing material layer is positioned at least 0.02 mm inwardly away from a respective outer peripheral end or an inner peripheral end of the metallization layer.

* * * * *